(12) United States Patent
Ryoo et al.

(10) Patent No.: US 8,384,060 B2
(45) Date of Patent: Feb. 26, 2013

(54) RESISTIVE MEMORY DEVICE

(75) Inventors: Kyung-Chang Ryoo, Gyeonggi-do (KR); Jae-Hee Oh, Gyeonggi-do (KR); Jung-Hoon Park, Seoul (KR); Hyeong-Jun Kim, Seoul (KR); Dong-Won Lim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 424 days.

(21) Appl. No.: 12/273,140

(22) Filed: Nov. 18, 2008

(65) Prior Publication Data

US 2009/0230376 A1   Sep. 17, 2009

(30) Foreign Application Priority Data

Mar. 11, 2008   (KR) .................. 10-2008-0022447

(51) Int. Cl.
*H01L 47/00* (2006.01)
*H01L 29/06* (2006.01)
*H01L 21/02* (2006.01)
*H01L 21/336* (2006.01)
*G11C 11/00* (2006.01)

(52) U.S. Cl. ......... 257/4; 257/5; 257/295; 257/E47.001; 438/294; 438/900; 438/947; 365/148; 365/163

(58) Field of Classification Search .................. 257/2, 5, 257/211, E27.004, E27.008, 11, 4, 295, E47.001; 365/148, 163; 438/294, 900, 947
See application file for complete search history.

(56) References Cited

U.S. PATENT DOCUMENTS

| | | | | |
|---|---|---|---|---|
| 6,232,147 B1 * | 5/2001 | Matsuki et al. | ............... | 438/108 |
| 6,306,680 B1 * | 10/2001 | Fillion et al. | .................. | 438/106 |
| 6,852,621 B2 * | 2/2005 | Hanaoka et al. | ............. | 438/638 |
| 6,933,156 B2 * | 8/2005 | Wang et al. | ....................... | 438/3 |
| 7,091,589 B2 * | 8/2006 | Mori et al. | .................... | 257/686 |
| 7,135,756 B2 * | 11/2006 | Pellizzer et al. | ............. | 257/565 |
| 7,253,463 B2 * | 8/2007 | Yamada | ....................... | 257/295 |
| 7,259,040 B2 | 8/2007 | Pellizer et al. | | |
| 7,718,988 B2 * | 5/2010 | Lee | ................... | 257/2 |
| 7,785,923 B2 * | 8/2010 | Chang et al. | .................... | 438/102 |
| 7,803,654 B2 * | 9/2010 | Lee et al. | ........................ | 438/95 |
| 2004/0137701 A1 * | 7/2004 | Takao | ........................... | 438/461 |
| 2005/0064606 A1 * | 3/2005 | Pellizzer et al. | ................... | 438/3 |
| 2005/0157477 A1 * | 7/2005 | Kuramochi et al. | .......... | 361/761 |
| 2005/0212037 A1 | 9/2005 | Pinnow et al. | | |
| 2006/0011959 A1 | 1/2006 | Park et al. | | |
| 2006/0169968 A1 | 8/2006 | Happ | | |
| 2006/0185141 A1 * | 8/2006 | Mori et al. | ................... | 29/25.41 |
| 2007/0045606 A1 * | 3/2007 | Magistretti et al. | ............... | 257/4 |
| 2007/0086235 A1 * | 4/2007 | Kim et al. | ..................... | 365/163 |
| 2007/0238279 A1 * | 10/2007 | Cerio, Jr. | ..................... | 438/597 |

(Continued)

FOREIGN PATENT DOCUMENTS

| | | |
|---|---|---|
| JP | 2007-067403 A1 | 3/2007 |
| KR | 1020060007326 A | 1/2006 |
| KR | 1020070026157 A | 3/2007 |
| KR | 1020070094023 A | 9/2007 |

*Primary Examiner* — Phat X Cao
*Assistant Examiner* — Diana C Vieira
(74) *Attorney, Agent, or Firm* — Myers Bigel Sibley & Sajovec, P.A.

(57) ABSTRACT

Provided is a resistive memory device that can be integrated with a high integration density and method of forming the same. In an embodiment, a bit line is formed of copper using a damascene technique, and when the copper bit line, a copper stud may be formed around the copper bit line.

16 Claims, 14 Drawing Sheets

U.S. PATENT DOCUMENTS

| | | | |
|---|---|---|---|
| 2008/0272355 A1* | 11/2008 | Cho et al. | 257/2 |
| 2009/0014709 A1* | 1/2009 | Pellizzer et al. | 257/5 |
| 2009/0067228 A1* | 3/2009 | Kang et al. | 365/163 |
| 2009/0127538 A1* | 5/2009 | Ryoo et al. | 257/5 |
| 2009/0224224 A1* | 9/2009 | Fujii et al. | 257/2 |
| 2009/0302299 A1* | 12/2009 | Chang | 257/4 |
| 2010/0207094 A1* | 8/2010 | Kanzawa et al. | 257/4 |

* cited by examiner

US 8,384,060 B2

RESISTIVE MEMORY DEVICE

CROSS-REFERENCE TO RELATED APPLICATIONS

This U.S. non-provisional patent application claims priority under 35 U.S.C. §119 of Korean Patent Application No. 10-2008-0022447, filed on Mar. 11, 2008, the entire contents of which are hereby incorporated by reference.

BACKGROUND

Embodiments of the present invention relate to resistive memory devices and methods of forming the same, and more particularly, to phase-change memory devices that can be integrated with a high integration density and methods of forming the same.

Phase-change memory devices are memory devices to store and read information using a difference in electrical conductivity (or resistivity) of phase-change material, for example, chalcogenide. These phase-change memory devices are highlighted as a next generation memory owing to their characteristics, such as random access and non-volatility.

However, like other memory devices, since the phase-change memory devices require a higher level of integration density, a new phase-change memory device capable of satisfying such a requirement and a method of forming the same are needed.

SUMMARY

Embodiments of the present invention provide resistive memory devices with a high integration density and method of forming the same.

Embodiments of the present invention also provide phase-change memory devices with a high integration density and method of forming the same.

In some embodiments of the present invention, resistive memory devices include a resistive memory element provided on a substrate. A bit line is provided on the resistive memory element. An upper stud is provided on and outside of the resistive memory element. The upper stud contains the same material as the bit line and has a lower surface which is leveled higher than a lower surface of the bit line.

In other embodiments of the present invention, resistive memory devices include a resistive memory element provided on a substrate. A bit line, including copper, is provided on the resistive memory element. A cell upper stud is provided on and outside of the resistive memory element. The cell upper stud includes copper and has a lower surface leveled higher than a lower surface of the copper bit line. A cell lower stud connected with the lower surface of the cell upper stud and including a different material than the cell upper stud is provided.

In still other embodiments of the present invention, resistive memory devices include a resistive memory element provided on a cell array region of a substrate. A bit line, including copper, is provided on the resistive memory element. A cell upper stud is provided on and outside of the resistive memory element. The cell upper stud includes copper and has a lower surface leveled higher than a lower surface of the copper bit line. A cell lower stud connected with the lower surface of the cell upper stud and including a different material than the cell upper stud is provided. A cell contact plug is provided between the substrate and the cell lower stud, electrically connected with the substrate and the cell lower stud, and having an upper surface having a diameter wider than a diameter of a lower surface of the cell lower stud.

In even other embodiments of the present invention, provided methods of forming a resistive memory device include a substrate with a resistive memory element and a cell contact plug. A first insulating layer having a cell contact hole exposing the cell contact plug is formed on the resistive memory element and the cell contact plug. A cell lower stud is formed in the cell contact hole. A second insulating layer is formed on the cell lower stud and the first insulating layer. A first opening exposing the resistive memory element and a second opening exposing the cell lower stud, are formed by patterning the second insulating layer and the first insulating layer. A bit line is formed in the first opening and a cell upper stud is formed in the second opening, the bit line being connected with the resistive memory element, and the cell upper stud being connected with the cell lower stud and having a lower surface which is leveled higher than a lower surface of the bit line.

In yet other embodiments of the present invention, memory arrays include a plurality of memory cells provided on a substrate. A word line is connected with memory cells arranged along the same row. A bit line is connected with memory cells arranged along the same column. The bit line includes copper, the word line includes a lower word line provided below the bit line and an upper word line provided on the bit line, the lower word line is connected with the upper word line through a contact, and the contact includes a contact plug connected with the lower word line, and a stud connected with the contact plug and the upper word line and containing copper.

In further embodiments of the present invention, resistive memory devices include a resistive memory element formed on a substrate. A first copper conductive line is connected with one end of the resistive memory element. A second copper conductive line connected with the other end of the resistive memory element is provided on the first copper conductive line.

BRIEF DESCRIPTION OF THE FIGURES

The accompanying figures are included to provide a further understanding of the present invention, and are incorporated in and constitute a part of this specification. The drawings illustrate exemplary embodiments of the present invention and, together with the description, serve to explain principles of the present invention. In the figures.

DETAILED DESCRIPTION OF PREFERRED EMBODIMENTS

Figure 1:
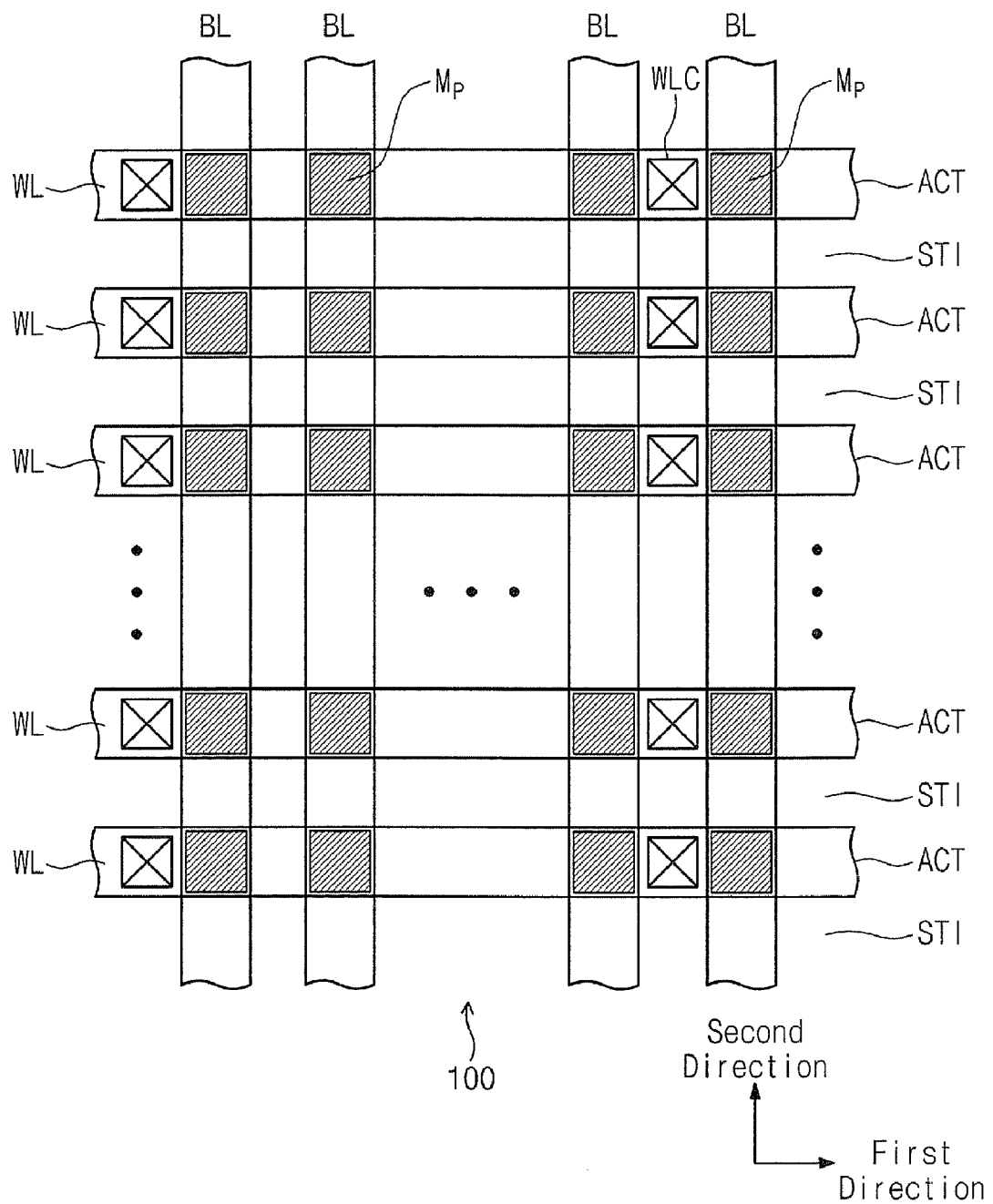
FIG. 1 is a plan view illustrating some of a cell array region of a substrate on which a resistive memory device is formed according to an embodiment of the present invention.

Embodiments of the present invention relate to resistive memory devices and methods of forming the same. A resistive memory device is a type of memory device using a resistive memory element that can represent at least two resistive states discernible according to a signal applied, e.g., high resistive state and low resistive state. The resistive memory element may include, for example, a perovskite memory element, a phase-change memory element, a magneto-resistive memory element, a conductive metal oxide (CMO) memory element, a solid electrolyte memory element, a resistive polymer memory element, a resistive polysilicon memory element and the like.

The perovskite memory element may include, for example, a colossal magnetoresistive (CMR) material, a high temperature superconducting (HTSC) material, or the like. The solid electrolyte memory element has metal ions movable in a solid electrolyte, and thus the solid electrolyte memory element may include a material that can form a conductive bridging.

Example embodiments of the present invention will now be described using a resistive memory device employing a phase-change memory element. Accordingly, it will be understood that descriptions to be mentioned below may be applied to resistive memory devices employing various types of memory elements described above.

An embodiment of the present invention provides a phase-change memory device and a method of forming the same. The phase-change memory device according to an embodiment of the present invention includes a phase-change memory element. The phase-change memory element according to embodiments of the present invention may include a phase-change material. For example, it will be understood that the phase-change memory element may indicate a phase-change material or a phase-change material layer and two electrodes connected with both surfaces of the phase-change material layer. The phase-change material may be a material of which crystalline state that may be reversely changed between a plurality of crystalline states showing different resistive states depending on heat. Electrical signals, such as current, voltage, optical signals, radiation or the like may be used to change the crystalline state of the phase-change material. For example, when a current flows between electrodes connected with both ends of a phase-change material, heat is provided to the phase-change material by a resistive heating. At this time, the crystalline state of the phase-change material may be changed depending on intensity of heat provided and time provided. For example, the phase-change material may have an amorphous state (or reset state) with a high resistance and a crystalline state (or set state) with a low resistance. The phase-change material may include, for example, chalcogenide. When a phase-change material according to embodiments of the present invention is expressed by 'XY', 'X' may include at least one selected from the group consisting of tellurium (Te), Selenium (Se), Sulphur (S), and polonium (Po), and 'Y' may include at least one selected from the group consisting of Antimony (Sb), Arsenic (As), Germanium (Ge), Tin (Sn), Phosphorous (P), Oxygen (O), Indium (In), Bismuth (Bi), Silver (Ag), Gold (Au), Palladium (Pd), Titanium (Ti), Boron (B), Nitrogen (N) and Silicon (Si).

Examples of the phase-change material according to an embodiment of the present invention may include chalcogenides such as Ge—Sb—Te (GST), Ge—Bi—Te (GBT), As—Sb—Te, As—Ge—Sb—Te, Sn—Sb—Te, In—Sn—Sb—Te, Ag—In—Sb—Te, an element in Group 5A of the periodic table-Sb—Te, an element in Group 6A of the periodic table-Sb—Te, an element in Group 5A of the periodic table-Sb—Se, an element in Group 6A of the periodic table-Sb—Se, and chalcogenides in which impurities are doped in the aforementioned chalcogenides. The impurities doped in the chalcogenides may include, for example, nitrogen, oxygen, silicon, or combinations thereof.

An embodiment of the present invention provides a method of forming a variety of conductive lines such as a bit line and a word line in a cell array region, and a local conductive line in a peripheral circuit region, as well as an interconnecting method between conductive structures in a phase-change memory device.

As the degree of integration increases, a distance between elements in a horizontal direction, a distance between a variety of conductive lines such as a bit line and a local conductive line, and a line width of such conductive lines decreases, but a height of layers stacked on a substrate in a vertical direction increases. The height increase in the vertical direction causes an increase in the aspect ratio in various openings, such as a contact hole, a via hole, etc., for an electrical connection between lower and upper conductive regions and conductive lines, between conductive regions, or between conductive lines. As the distance between adjacent conductive lines decreases, it is difficult to form a conductive line using an etching, and the resistance of the conductive line increases due to a decrease in the line width. Also, as the aspect ratio of an opening increase, it becomes difficult to fill the opening with a conductive material, and the resistance of the conductive material filled in the opening also increases.

Accordingly, an embodiment of the present invention provides a method of forming at least conductive line, for example a bit line, using a damascene technique and copper.

According to another embodiment of the present invention, when a copper bit line is formed using a damascene technique, a part of a contact structure for an electrical connection between conductive regions, between a conductive region and a conductive line, or between conductive lines is formed of copper at a position adjacent to the copper bit line. For example, when a stripe type opening for a bit line is formed, a hole type opening for a part of a contact structure is formed, the stripe type opening for a bit line is filled with copper to form a copper bit line, and the opening for a part of a contact structure is filled with copper to form a copper stud.

According to yet another embodiment of the present invention, before the copper bit line and the copper stud are formed, a metal stud may be formed of tungsten or the like so as to further decrease the aspect ratio of the opening in which the copper stud will be formed.

Terms such as "lower surface" and "upper surface" used in relation to elements of the present specification are relative terms which indicate a "relatively close surface to" and a "relatively distant surface from" a main surface of a substrate respectively. Also, it will be understood that in the present specification, the heights of elements' surfaces may be compared with respect to a main surface of a substrate. For example, it will be understood that when a lower surface of one element is referred to as being "lower" than a lower surface of another element, the description may indicate that the lower surface of the one element is positioned closer to a main surface of a substrate than the lower surface of the other element.

A term 'conductive material' used in the present specification includes, but is not limited to, metal, conductive metal nitride, conductive metal oxide, conductive oxide nitride, silicide, metal alloy or combinations thereof. Examples of the metal include copper (Cu), aluminum (Al), tungsten titanium (TiW), tantalum (Ta), Molybdenum (Mo), tungsten (W) and the like. Conductive metal nitride includes, but is not limited to, for example, titanium nitride (TiN), tantalum nitride (TaN), Molybdenum nitride (MoN), niobium nitride (NbN), titanium silicon nitride (TiSiN), titanium aluminum nitride (TiAlN), titanium boron nitride (TiBN), zirconium silicon nitride (ZrSiN), tungsten silicon nitride (WSiN), tungsten boron nitride (WBN), zirconium aluminum nitride (ZrAlN), molybdenum silicon nitride (MoSiN), molybdenum aluminum nitride (MoAlN), tantalum silicon nitride (TaSiN), tantalum aluminum nitride (TaAlN) and the like. Examples of the conductive oxide nitride include, but are not limited to, titanium oxide nitride (TiON), titanium aluminum oxide nitride (TiAlON), tungsten oxide nitride (WON), tantalum oxide nitride (TaON) and the like. Examples of the conductive metal oxide include, but are not limited to, conductive novel metal oxides, such as iridium oxide (IrO), ruthenium oxide (RuO) and the like.

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, like reference numerals in the drawings denote like elements, and thus their description will be omitted.

In the present specification, 'substrate' or 'semiconductor substrate' or 'semiconductor layer' may indicate a semiconductor based structure with a silicon surface. Also, 'substrate' or 'semiconductor substrate' or 'semiconductor layer' may indicate a conductive region, an insulating region, and/or a semiconductor based structure on which a device is formed. Such a semiconductor based structure may indicate, for example, a silicon layer, a silicon on insulator (SOI) layer, a silicon-germanium (SiGe) layer, a germanium (Ge) layer, a gallium-arsenide (GaAs) layer, a doped or undoped silicon layer, a silicon epitaxial layer supported by a semiconductor structure, or any semiconductor structures.

It will be understood that when an element or layer is referred to as being "on", or "formed on" another element or layer, it may be directly on or formed on the other element or layer, or intervening elements or layers may be present or formed. Also, it will be understood that, although the terms first, second, third, etc. may be used herein to describe various elements, such as studs, conductive lines, contact plugs, insulating layers, conductive materials, contact holes, via holes, opening and the like throughout the present specification, these elements should not be limited by these terms. These terms may be only used to distinguish one element from another region.

FIG. 1 is a plan view illustrating a part of a cell array region of a substrate 100 provided with a resistive memory device according to an embodiment of the present invention. Referring to FIG. 1, the substrate 100 includes an element region ACT of a stripe pattern extending in a first direction, for example, a row direction. By implanting impurities into this element region ACT, word lines WL may be formed. A shallow trench isolation region STI is positioned at a region other than the element region ACT.

Bit lines BL of a stripe pattern extending in a column direction are arranged to cross the word lines WL. Memory cells may be positioned at crossing portions of the bit lines BL and the word lines WL. In an embodiment of the present invention, a memory cell may include, for example, a resistive memory element Mp, such as a phase-change memory element. One end of the resistive memory element Mp is connected with the bit line BL and the other end is connected with the word line WL. A selection element may be positioned between the word line WL and the other end of the resistive memory element Mp. According to an embodiment of the present invention, the resistive memory element Mp may include a phase-change material. This phase-change material may be a material of which crystalline state can be reversely changed by a signal applied thereto, for example, an electrical signal, an optical signal or a radiation, such as a voltage or current. For example, the resistive memory element Mp may include a phase-change material, such as chalcogenide.

The arrangement of the word lines WL and the bit lines BL may be changed variously. For example, the word line WL may be positioned closer to the substrate 100 than the bit line BL. To the contrary, the bit line BL may be positioned closer to the substrate 100 than the word line WL.

To decrease the resistance of the word line WL, the word line WL may be electrically connected with a conductive line having a low resistance through a contact structure WLC. For example, a conductive line with a low resistance used for decreasing the resistance of the word line WL may be referred to as an upper word line UWL in consideration that the conductive line is more distant from the substrate 100 than the word line WL. The word line WL may be referred to as a lower word line in consideration of this upper word line. Also, it will be understood that the word line WL may indicate the upper word line UWL as well as the lower word line LWL. The contact structure WLC may be positioned between the resistive memory elements Mp adjacent to each other in the first direction. The contact structure WLC may be formed per a predetermined number of memory cell(s), for example, per eight adjacent memory cells. That is, eight memory cells may be arranged between the contact structures WLC adjacent to each other in the first direction. Also, the contact structure may be formed per an unspecified number of memory cells. That is, various numbers of memory cells, for example, sixteen, thirty two memory cells may be arranged between the contact structures WLC adjacent to each other in the first direction.

Figure 2:
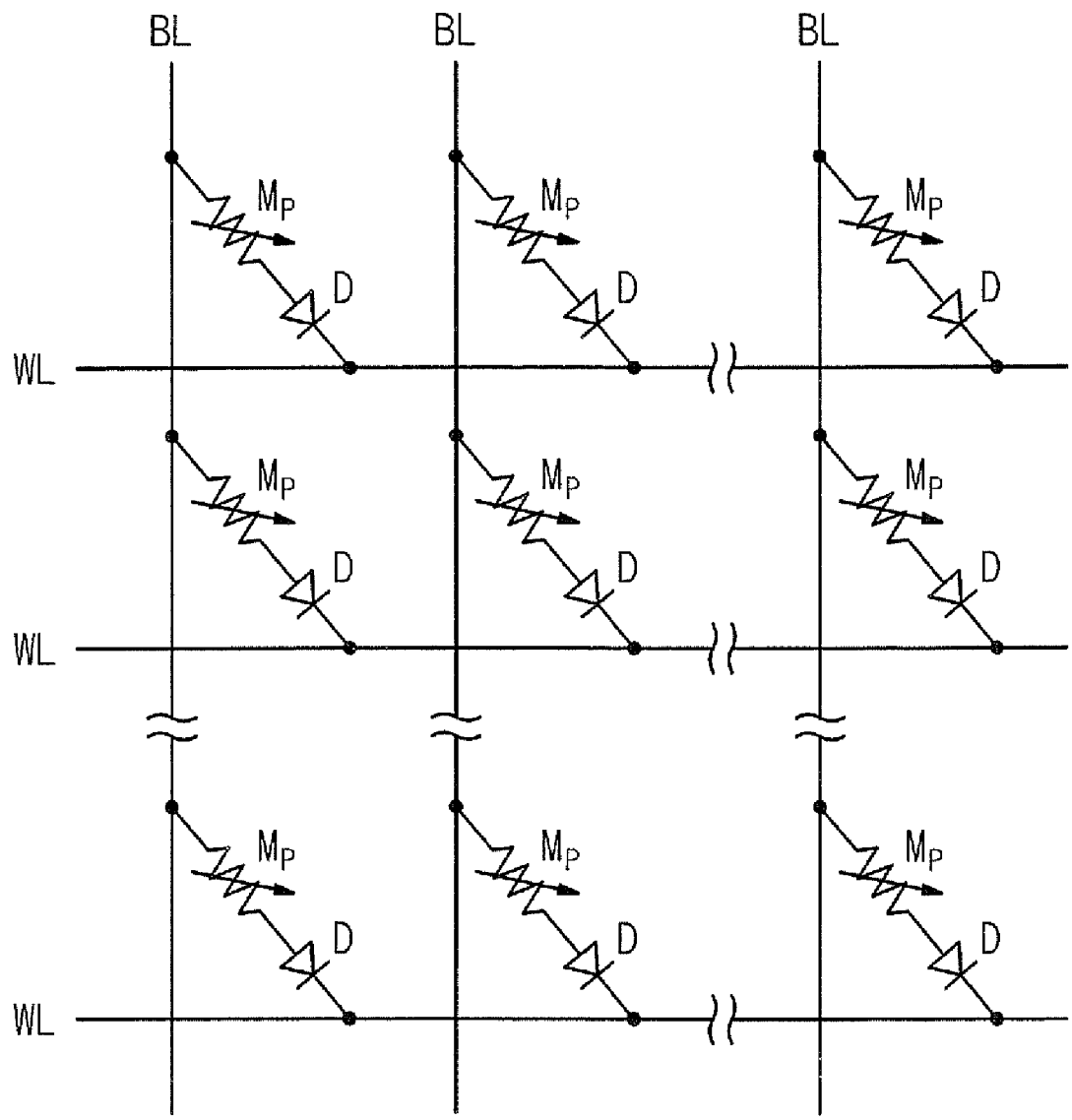
FIG. 2 is an equivalent circuit diagram of some of a cell array region of a resistive memory device according to an embodiment of the present invention.

FIG. 2 is an equivalent circuit diagram of a part of a cell array region of a resistive memory device according to an embodiment of the present invention. Referring to FIG. 2, one end of a memory element Mp, for example, a phase-change memory element may be connected with a bit line BL, and the other end may be connected with a word line WL. A selection element D for selecting the memory element Mp may include, but is not limited to, a diode, a MOS transistor, and a MOS diode. A diode D is illustrated as one example of the selection element in FIG. 2.

A method of forming a phase-change memory device according to an embodiment of the present invention will now be described with reference to FIGS. 3 through 8. FIGS. 3 through 8 illustrates sectional views of a memory cell array region and a peripheral circuit region. In the case of the memory cell array region, a sectional view in a row direction (i.e., a sectional view in an extending direction of the word line) and a sectional view in a column direction (i.e., a sectional view in an extending direction of the bit line) are shown together. In FIGS. 3 through 9, the left drawings are sectional views in the row direction of the memory cell array region, the middle drawings are sectional views in the column direction of the memory cell array region, and the right drawings are sectional views of the peripheral circuit region.

Figure 3:
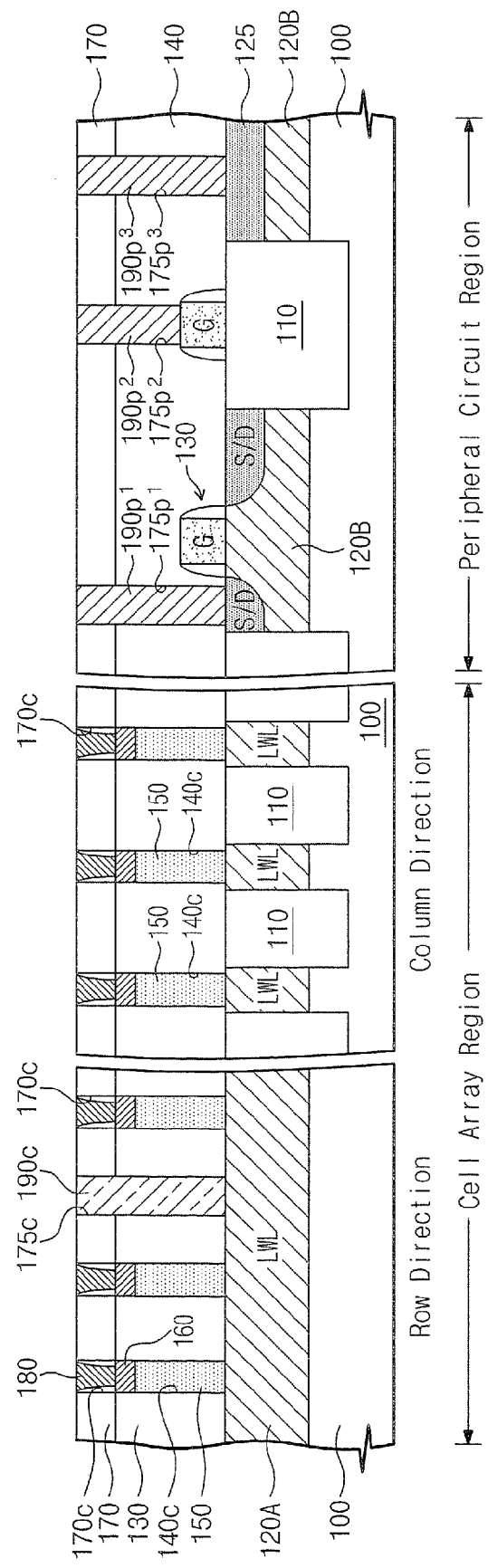
FIGS. 3 through 8 are sectional views for explaining a method of forming a phase-change memory device according to an embodiment of the present invention.

Referring to FIG. 3, element regions 120A and 120B defined by a device isolation region 110 are formed in a substrate, and then impurities are implanted into the element region 120A of a cell array region to form lower word lines LWL. The lower word lines LWL may have, for example, a stripe pattern extending in a row direction. Also, the lower word lines LWL may be formed by using various different methods. For example, the lower word lines LWL may be formed by forming epitaxial semiconductor patterns shaped in a plurality of parallel stripe patterns on a substrate 100 and implanting impurity ions into the epitaxial semiconductor patterns. The device isolation region 110 may be formed, for example, by etching a part of the substrate 100 to form a trench and filling the trench with an insulating material. A driver transistor 130 including source/drain S/D and gate G is formed on the element region 120B of the peripheral circuit region by using a conventional process. In describing an embodiment of the present invention, when various openings (such as a contact hole, a via hole, and a stripe pattern hole) having the same or similar structures or functions are formed simultaneously in the cell array region and in the peripheral circuit region, these openings in the cell array region and the peripheral circuit region may be distinguished by preceding an element formed in the cell array region with the term 'cell' and preceding an element formed in the peripheral circuit region with the term 'peripheral'. Likewise, contact structures filling various openings and formed in the cell array region and the peripheral circuit region may be distinguished by using the terms 'cell' and 'peripheral'.

After the lower word lines LWL and the driver transistors 130 are formed, a first interlayer insulating layer 140 is formed on the substrate 100. The first interlayer insulating layer 140 is patterned to form a lower contact hole 140c exposing the lower word line LWL. A selection element 150 such as a diode is formed in the lower contact hole 140c. The diode 150 may be formed by forming a semiconductor layer of germanium, silicon, or germanium-silicon in the lower contact hole 140c and then implanting impurity ions into the semiconductor layer. The semiconductor layer in the lower contact hole 140c may be formed by using a selective epitaxial growth (SEG) technique, a solid phase epitaxial technique or the like. The SEG is a method, which grows a semiconductor epitaxial layer using the exposed lower word line LWL as a seed layer. Unlike this, the solid phase epitaxial technique is a method, which forms an amorphous semiconductor layer or a polycrystalline semiconductor layer in the lower contact hole 140c and then crystallizing the same.

Before the impurities for forming the diode are implanted into the semiconductor layer in the lower contact hole 140c, a part of the semiconductor layer formed in the lower contact hole 140c may be removed. By doing so, the recessed diode 150 having an upper surface which is leveled lower than an upper surface of the first interlayer insulating layer 140.

A remaining portion of the lower contact hole 140c is filled with a conductive material such as tungsten to form a conductive plug 160 at an upper portion of the lower contact hole 140c. Before the conductive plug 160 is formed, a silicide layer may be formed on the diode 150 in consideration of a contact resistance characteristic with the diode 150. For example, this silicide layer may be a cobalt silicide, a nickel silicide, a tungsten silicide or a titanium silicide.

A second interlayer insulating layer 170 is formed on the first interlayer insulating layer 140 and the conductive plug 160. The second interlayer insulating layer 170 is patterned to form an upper contact hole 170c exposing the conductive plug 160. A conductive material for an electrode is filled in the upper contact hole 170c to form a first electrode 180. Before the conductive material for an electrode is filled, an insulating spacer may be formed on a sidewall of the upper contact hole 170c. This insulating spacer reduces a diameter of the upper contact hole 170c in which the first electrode 180 is formed, so that a contact area between the first electrode 180 and a phase-change material to be formed later decreases.

In the cell array region, the second interlayer insulating layer 170 and the first interlayer insulating layer 140 are patterned to form a cell contact hole 175c exposing the lower word line LWL. In the peripheral meanwhile, in the peripheral circuit region, peripheral contact holes 175p1, 175p2 and 175p3 exposing the gate G, source/drain S/D of the driver transistor 130, and an impurity diffusion region formed on an element region 120B are formed. Conductive material layers, for example, a titanium nitride layer and a tungsten layer are sequentially filled in the cell contact hole 175c to form a cell contact plug 190c. In the meanwhile, peripheral contact plugs 190p1, 190p2 and 190p3 are formed in the peripheral contact holes 175p1, 175p2 and 175p3.

Figure 4:
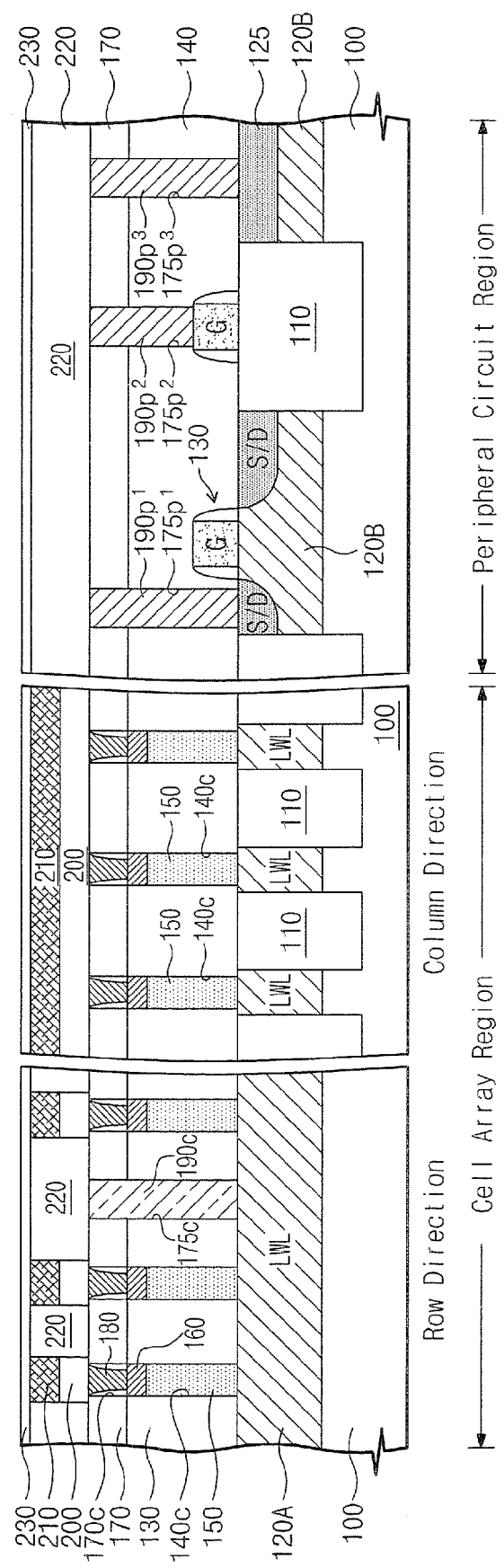

Next, referring to FIG. 4, a phase-change material layer 200 and a second electrode 210 are correspondingly formed on the first electrode 180. Herein, the phase-change material layer 200 may be formed such that at least two memory cells in the same column or row share the phase-change material layer 200. That is, the phase-change material layer 200 may be formed in a stripe pattern extending in the column direction or in the row direction. The phase-change material layer 200 with the stripe pattern extending in the column direction is shown in the drawing. Unlike this, the phase-change material layer 200 may be formed such that it is separated in the unit of an adjacent memory cell. That is, the phase-change material layer 200 may be formed in an island type.

An insulating layer is formed and then planarized such that the second electrode 210 is exposed, to form a third interlayer insulating layer 220 with a flat upper surface. The third interlayer insulating layer 220 covers sidewalls of the phase-change material layer 200 and sidewalls of the second electrode 210. In the peripheral circuit region, the third interlayer insulating layer 220 is formed on the second interlayer insulating layer 170. An etch stop layer 230 is formed on the third interlayer insulating layer 220 and the second electrode 210. The etch stop layer 230 is a layer for securing a process margin for a subsequent photolithography process.

Figure 5:
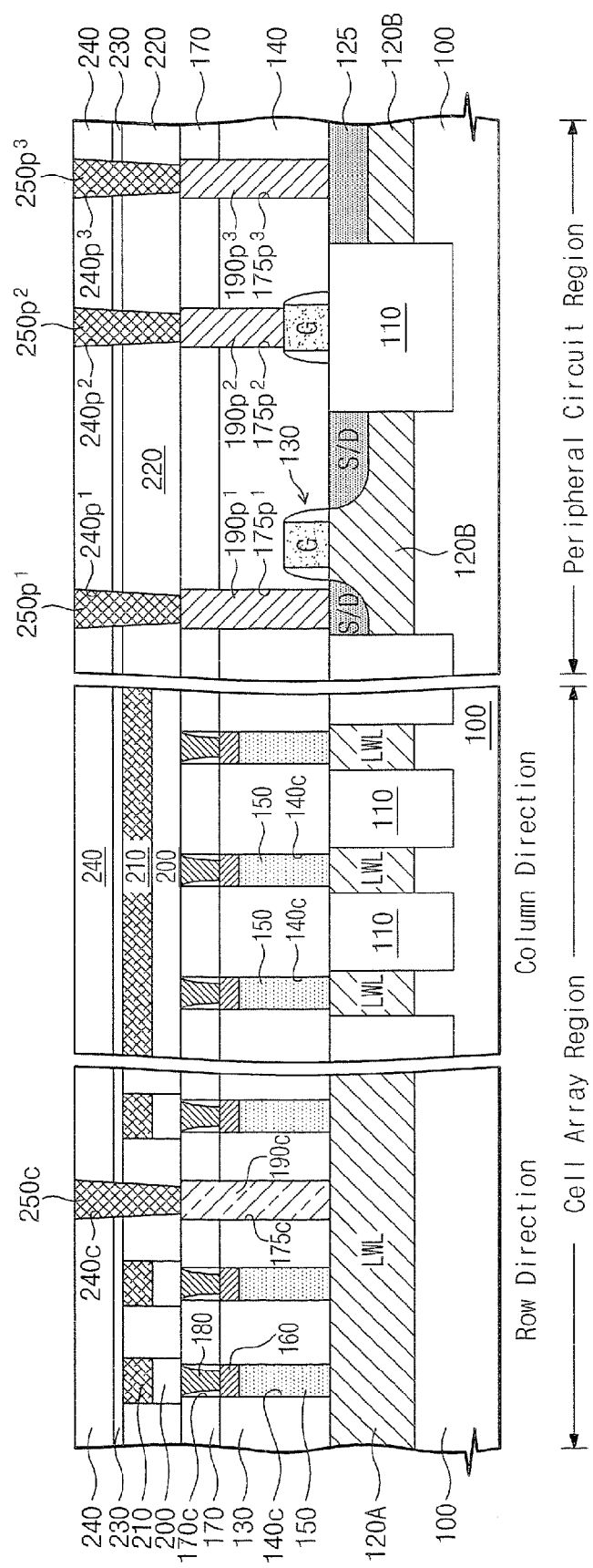

Next, referring to FIG. 5, a fourth interlayer insulating layer 240 is formed on the etch stop layer 230. The fourth interlayer insulating layer 240, the etch stop layer 230 and the third interlayer insulating layer 220 are patterned to form a cell contact hole 240c and peripheral contact holes 240p1-240p3 exposing the fourth interlayer insulating layer 240, the etch stop layer 230 and the third interlayer insulating layer 220, respectively. Conductive material layers, for example, a titanium nitride layer and a tungsten layer are sequentially filled in these contact holes 240c, 240p1-240p3 to form a cell lower stud 250c and peripheral lower studs 250p1-250p3 connected with the corresponding contact plugs.

Figure 6:
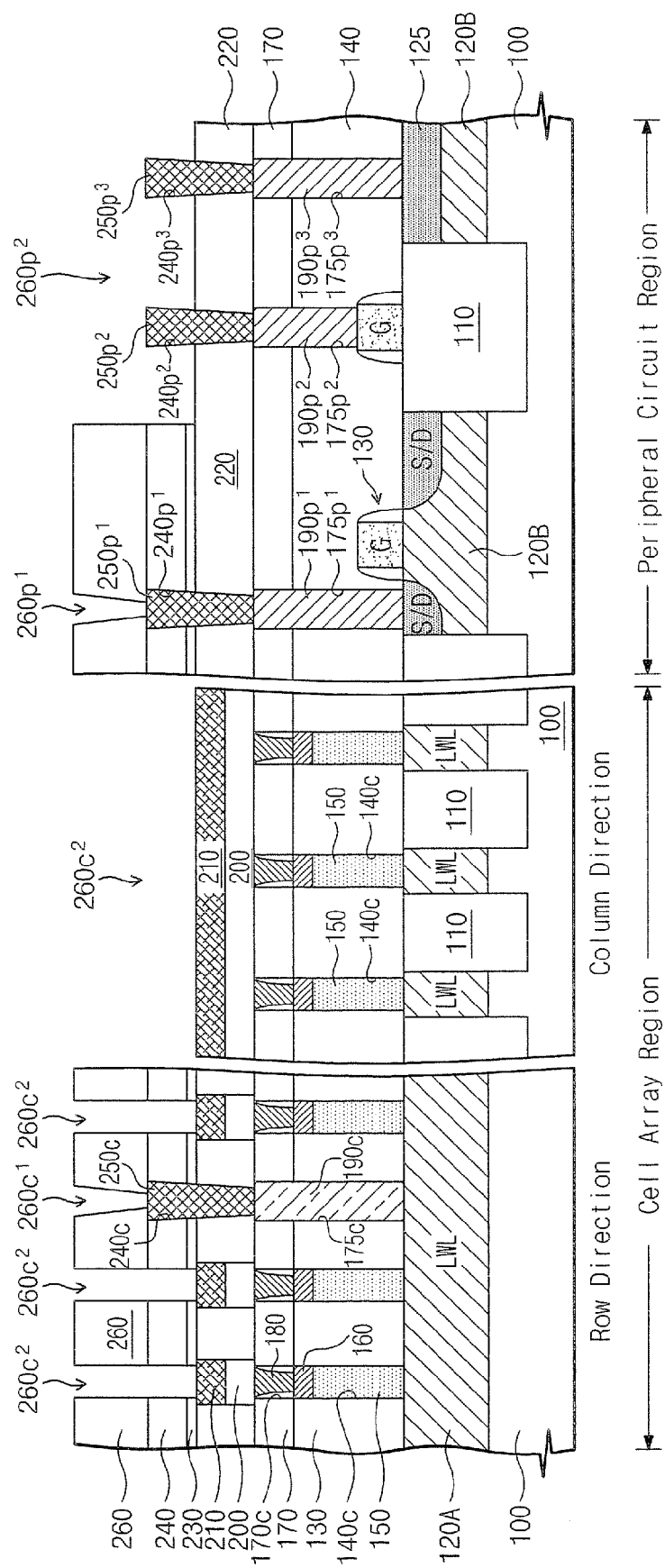

Next, referring to FIG. 6, a fifth interlayer insulating layer 260 is formed on the fourth interlayer insulating layer 240 and the lower studs 250c, 250p1-250p3. In the cell array region, the fifth interlayer insulating layer 260 is patterned to form a cell contact opening 260c1 shaped in a hole and exposing the cell lower stud 250c and at the same time the fifth interlayer insulating layer 260, the fourth interlayer insulating layer 240 and the etch stop layer 230 are patterned to form a cell stripe opening 260c2 shaped in a stripe and used for a bit line, the cell stripe opening 260c2 exposing the second electrode 210. In the meanwhile, in the peripheral circuit region, the fifth interlayer insulating layer 260 is patterned to form a peripheral contact opening 260p1 shaped in a hole and exposing the peripheral lower stud 250p1, and the fifth interlayer insulating layer 260, the fourth interlayer insulating layer 240 and the etch stop layer 230 are patterned to form a peripheral stripe opening 260p2 shaped in a stripe and used for a first conductive line, the peripheral stripe opening 260p2 exposing a part of sidewalls and an upper surface of the peripheral lower studs 250p2 and 250p3.

Figure 7:
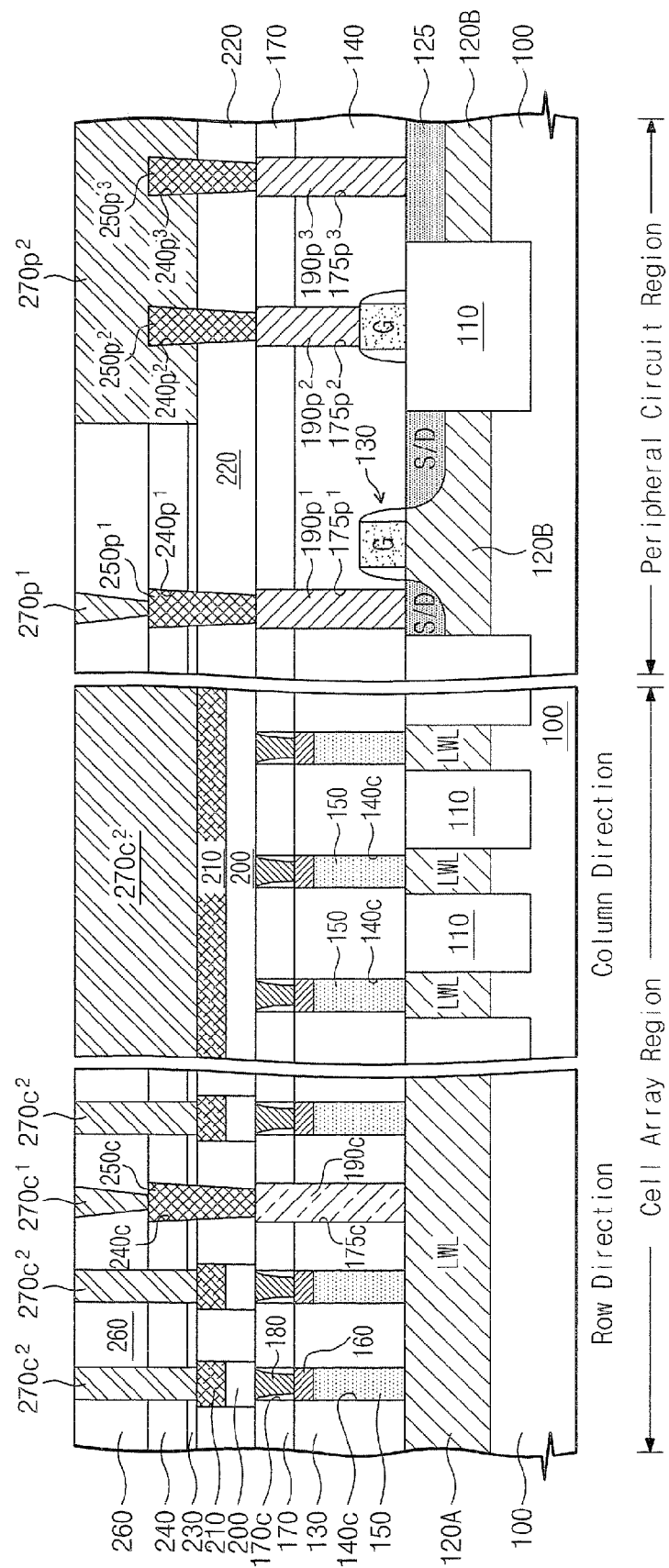

Next, referring to FIG. 7, a conductive material, preferably, a copper layer is filled in the cell contact opening 260c1, the cell stripe opening 260c2, the peripheral contact opening 260p1, and the peripheral stripe opening 260p2 to form a cell upper stud 270c1, a bit line 270c2, a peripheral upper stud 270p1 and a first conductive line 270p2. The cell upper stud 270c1 is electrically connected with the cell lower stud 250c. The bit line 270c2 is electrically connected with the second electrode 210. The peripheral upper stud 270p1 is electrically connected with the peripheral lower stud 250p1 and the first conductive line 270p2 is electrically connected with the peripheral lower studs 270p2 and 270p3. Herein, the first conductive line 270p2 may not have a conductive line structure but may have a contact pad structure electrically connecting the peripheral lower studs 250p2 and 250p3 with each other.

The first conductive line 270p2 may contact a part of sidewalls of and an upper surface of the peripheral lower studs 250p2 and 250p3. A part of a lower surface of the first conductive line 270p2 may be lower than upper surfaces of the peripheral lower studs 250p2 and 250p3. For example, the lower surface of the first conductive line 270p2 may contact an upper surface of the third interlayer insulating layer 220. Accordingly, the lower surface of the first conductive line 270p2 may have an uneven pattern.

Figure 8:
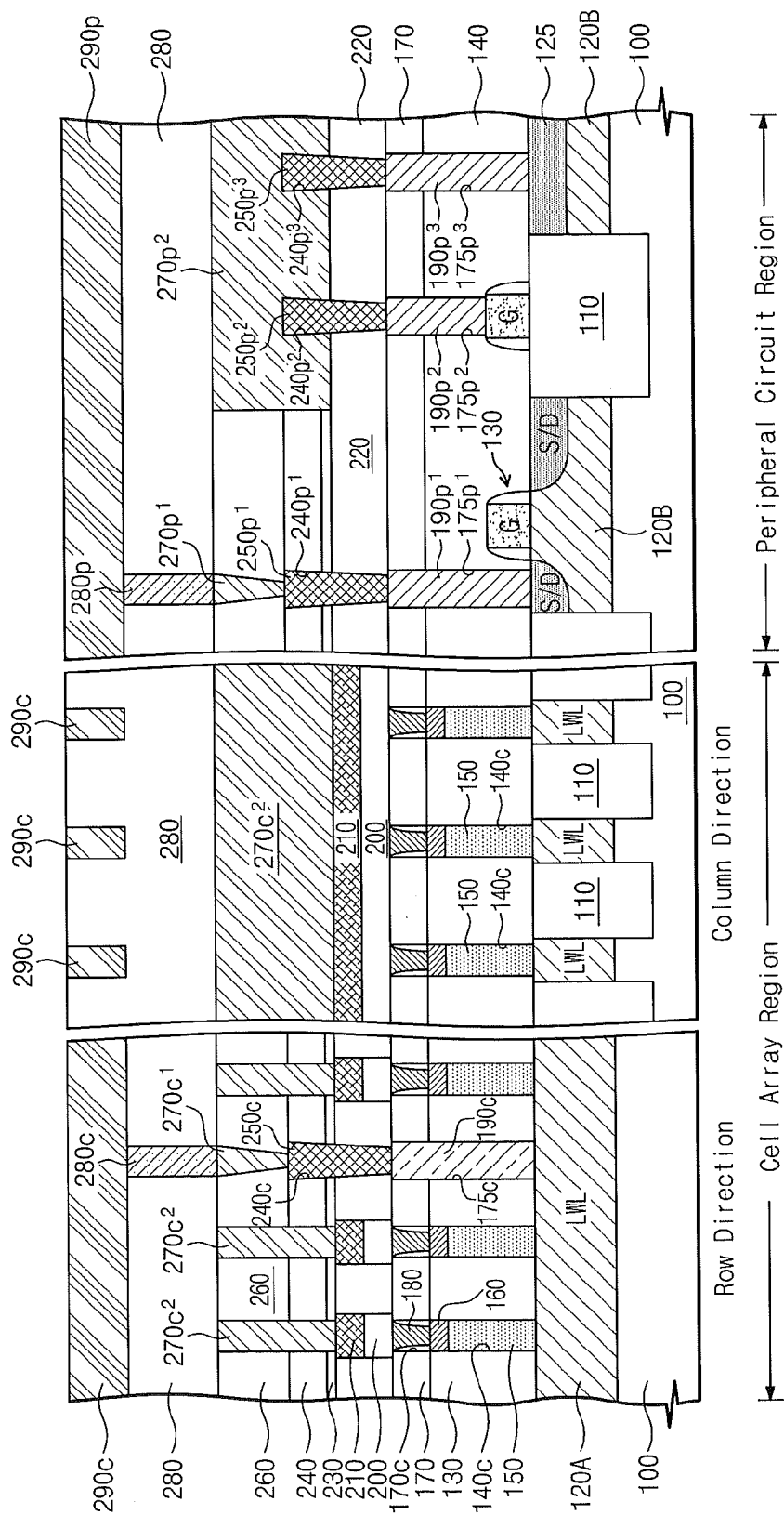

Referring to FIG. 8, a sixth interlayer insulating layer 280 is formed on the bit line 270c2, the cell upper stud 270c1, the first conductive line 270p2, the peripheral upper stud 270p1, and the fifth interlayer insulating layer 260. The sixth interlayer insulating layer 280 is patterned to form a cell via hole 280c exposing the cell upper stud 270c1 and a stripe-shaped cell opening defining an upper word line in the cell array region. Similarly, a peripheral via hole 280p and a stripe-shaped peripheral opening are formed in the peripheral circuit region to expose a peripheral upper stud 270p1 and to define a conductive line, respectively. The cell via hole, the stripe-shaped cell opening, the peripheral via hole and the stripe-shaped peripheral opening are filled with a conductive material layer, for example, a copper layer to form an upper word line 290c electrically connected with the cell upper stud 270c1 in the cell array region. In the meanwhile, in the peripheral region, the peripheral via hole and the peripheral opening are filled with the copper layer to form a second conductive line 290p electrically connected with the peripheral upper stud 270p1.

According to the above-described embodiment of the present invention, a damascene technique using copper is applied to a method of forming a phase-change memory device. According to the above-described method, when a copper bit line electrically connected with a phase-change memory element is formed, a copper stud connected with a cell contact plug may be formed simultaneously with the copper bit line. Before the copper stud is formed, a tungsten stud connected with the cell contact plug may be formed.

According to the above-described embodiment of the present invention, the contact structure electrically connecting the lower word line LWL and the upper word line 290c may include, for example, the cell contact plug 190c having a titanium nitride layer and a tungsten layer stacked sequentially, and the cell upper stud 270c1 containing copper. Also, the cell lower stud 250c having a nitride layer and a tungsten layer stacked sequentially may be provided between the cell contact plug 190c and the cell upper stud 270c1 290c1. The diameter of the upper surface of the cell contact plug 190c may be larger than the diameter of the lower surface of the cell lower stud 250cm.

Figure 9:
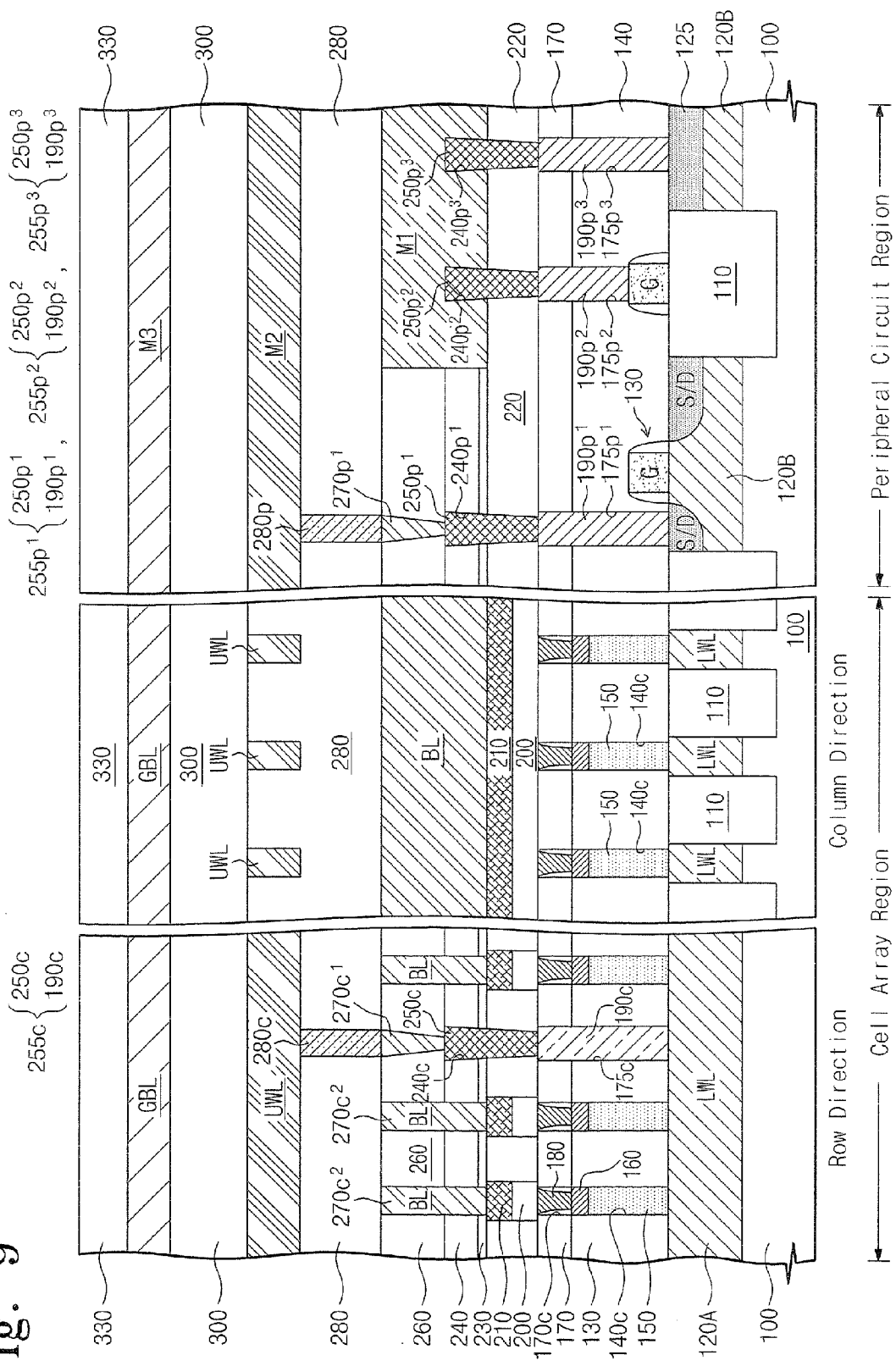
FIG. 9 is sectional views illustrating a phase-change memory device according to an embodiment of the present invention.

FIG. 9 is sectional views illustrating a phase-change memory device according to an embodiment of the present invention, and shows sections of a memory cell array region and a peripheral circuit region. For more apparent understanding of a phase-change memory device according to an embodiment of the present invention, a section of the memory cell array region in the row direction (taken in an extending direction of the word line) and a section of the memory cell array region in the column direction (taken in an extending direction of the bit line) are all shown. The left drawing of FIG. 9 is a section view in the row direction, the middle drawing is a sectional view in the column direction, and the right drawing of FIG. 9 is a sectional view in the peripheral circuit region.

Referring to FIG. 9, a plurality of word lines, i.e., lower word lines LWL are provided on a semiconductor substrate 100 of the memory cell array region. The lower word lines LWL may be formed, for example, by doping a semiconductor layer with n-type impurities. For example, the lower word lines LWL may extend in the row direction. The lower word lines LWL may include a metal layer, a conductive metal nitride layer, a conductive metal oxide layer, a conductive oxide nitride layer, a silicide layer, a metal alloy layer or combinations thereof. An insulating layer, such as a device isolation layer 110, may electrically insulate the lower word lines LWL adjacent to each other. In the peripheral circuit region, a driver element for driving a memory cell array region, for example, a driver transistor may be provided on an active region 120B defined by the device isolation layer 110.

A plurality of bit lines BL is provided on the substrate 100 of the memory cell array region to cross the lower word lines LWL. In the peripheral circuit region, a first conductive line M1 corresponding to the bit line BL is provided. The first conductive line M1 may be electrically connected with a gate G, source/drain region S/D of the driver transistor 130. The bit line BL and the first conductive line may include copper. According to an embodiment of the present invention, since the bit line BL and the first conductive line M1 may be formed of copper using a damascene technique, it is possible to decrease the resistances of the bit line BL and the first conductive line M1.

A phase-change material layer 200 is positioned between the lower word line LWL and the bit line BL. A first electrode 180 and a selection element 150 are provided between the phase-change material layer 200 and the lower word line LWL, and a second electrode 210 is provided between the phase-change material layer 200 and the bit line BL. In other words, the first electrode 180 and the second electrode 210 are connected with the phase-change material layer 200. The first electrode 180 may be used, for example, as a heater for heating the phase-change material layer 200. The first electrode 180 is electrically connected with the lower word line LWL, for example, through the selection element 150 such as a diode. The second electrode 210 is electrically connected with the bit line BL.

The selection element 150 may include an n-type semiconductor layer and a p-type semiconductor layer stacked on the substrate 100. The p-type semiconductor layer may be adjacent to the first electrode 180 and the n-type semiconductor layer may be adjacent to the lower word line LWL.

In the cell array region, a cell contact structure 255c, which is adjacent to the bit line BL, is electrically connected with the lower word line LWL, and includes a cell contact plug 190c and a cell lower stud 250c, may be provided. A cell upper stud 270c1 formed of the same material as that of the bit line BL is provided on the cell contact structure 255c. An upper surface of the cell upper stud 270c1 may have substantially the same height as an upper surface of the bit line BL. An upper surface of the cell contact structure 255c, more specifically, an upper surface of the cell lower stud 250c may be higher than the lower surface of the bit line BL. Accordingly, a lower surface of the cell upper stud 270c1 may be higher than a lower surface of the bit line BL. For example, a width of the cell upper stud 270c1 may be narrower than a width of the bit line BL. For example, when the cell upper stud 270c1 and the bit line BL are formed of copper using a damascene technique, the aspect ratio of a cell contact hole for the cell upper stud 270c1 may be decreased to enhance a copper filling characteristic. Also, the cell upper stud 270c1 may be formed simultaneously with the bit line BL. That is, since while the bit line BL is formed, the cell upper stud 270c1 may be formed together with the bit line BL, a contact resistance can be reduced.

The cell contact plug 190c, the cell lower stud 250c and the cell upper stud 270c1 may constitute a word line contact structure WLC connecting the lower word line LWL and the upper word line UWL as shown in FIG. 1.

Meanwhile, in the peripheral circuit region, peripheral contact structures 255p1-255p3 corresponding to the cell contact structure 255c may be provided. The peripheral contact structures 255p1-255p3 may also include peripheral contact plugs 190p1-190p3 and peripheral lower studs 250p1-250p3. The peripheral contact structures 255p1-255p3 may be electrically connected with the gate G, source/drain region S/D of the driver transistor 130, or impurity diffusion region 125.

Like the cell contact structure 255c, a peripheral upper stud 270p1 may be provided on the peripheral contact structure 255p1, more specifically, on the peripheral lower stud 250p1. A first conductive line M1 may contact a part of sidewalls of and an upper surface of the peripheral lower studs 250p2 and 250p3 of the peripheral contact structures 255p2 and 255p3. Thus, a coupling between the first conductive line M1 and the peripheral contact structures 255p2 and 255p3 can be reinforced. Also, a contact resistance characteristic between the first conductive line M1 and the peripheral contact structures 255p2 and 255p3 connected with the first conductive line M1 can be enhanced.

According to an embodiment of the present invention, the cell contact plug 190c and/or the cell lower stud 250c may be formed of a different material than that of the cell upper stud 270c1. Likewise, the peripheral contact plugs 190p1-190p3 and/or the peripheral lower studs 250p1-250p3 may be formed of a different material than that of the peripheral upper stud 270p1.

In an embodiment of the present invention, the contact plug and the lower stud corresponding to the contact plug may be formed of the same material. Also, the lower stud and the upper stud corresponding to the lower stud may be formed of different materials. For example, the upper stud may include copper but the lower stud may not include copper. For example, the lower stud may include tungsten.

In an embodiment of the present embodiment, the diameter of an upper surface of the cell contact plug 190c may be larger than the diameter of a lower surface of the cell lower stud 250c. That is, a sidewall of the cell contact structure 255c may have a step. Likewise, a diameter of the peripheral contact plugs 190p1-190p3 may be larger than a diameter of the peripheral lower studs 250c1-250c3. That is, a sidewall of the peripheral contact structures 255p1-255p3 may have a step.

An upper word line UWL for decreasing the resistance of the lower word line LWL may be, for example, connected with the word line contact structure WLC of the cell array region, more specifically, with the cell upper stud 270c1. In the meanwhile, in the peripheral circuit region, a second conductive line M2 corresponding to the upper word line UWL may be provided. The second conductive line M2 may be, for example, connected with the peripheral upper stud 270p1. Alternatively, the second conductive line M2 may be connected with the first conductive line M1. According to an embodiment of the present invention, since the upper word line UWL and the second conductive line M2 may be formed of copper using a damascene technique, the resistances of the upper word line UWL and the second conductive line M2 can be decreased.

In the cell array region, a global bit line GBL is provided on the upper word line UWL, and in the peripheral circuit region, a third conductive line M3 corresponding to the global bit line GBL is provided on the second conductive line M2. The global bit line GBL and the third conductive line M3 may include copper. Since the global bit line GBL and the third conductive line M3 may be formed of copper using a damascene technique, the resistances of the global bit line GBL and the third conductive line M3 can be decreased. The third conductive line M3 may be electrically connected with the second conductive line M2.

A passivation layer 330 may be provided on the global bit line GBL and the third conductive line M3.

According to another embodiment of the present invention, in order to obtain a higher integration density, the phase-change memory device may be formed in a multi-level on a substrate.

The aforementioned resistive memory device may be embodied in various forms or may be used as one element for various apparatuses. For example, the aforementioned resistive memory device may be applied for realizing various types of memory cards, USB memories, solid-state drivers, etc.

Figure 10:
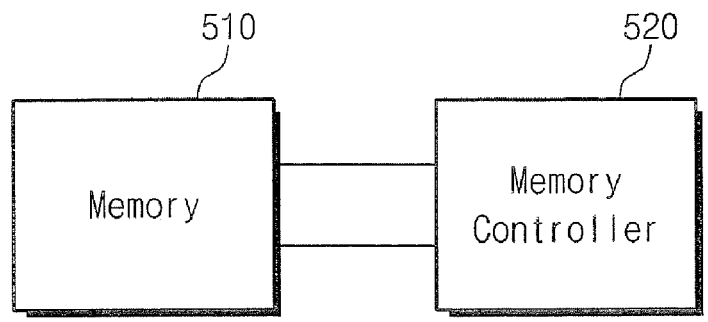
FIGS. 10 through 17 show apparatuses including a phase-change memory device according to embodiments of the present invention.

FIG. 10 illustrates an apparatus including a resistive memory device according to an embodiment of the present invention. As shown in the drawing, the apparatus of the present embodiment includes a memory 510 and a memory controller 520. The memory 510 may include a resistive memory device according to the above-described embodiments of the present invention. The memory controller 520 may supply an input signal for controlling an operation of the memory 510. For example, the memory controller 520 may supply a command language and an address signal. The memory controller 520 may control the memory 510 based on a received control signal.

Figure 11:
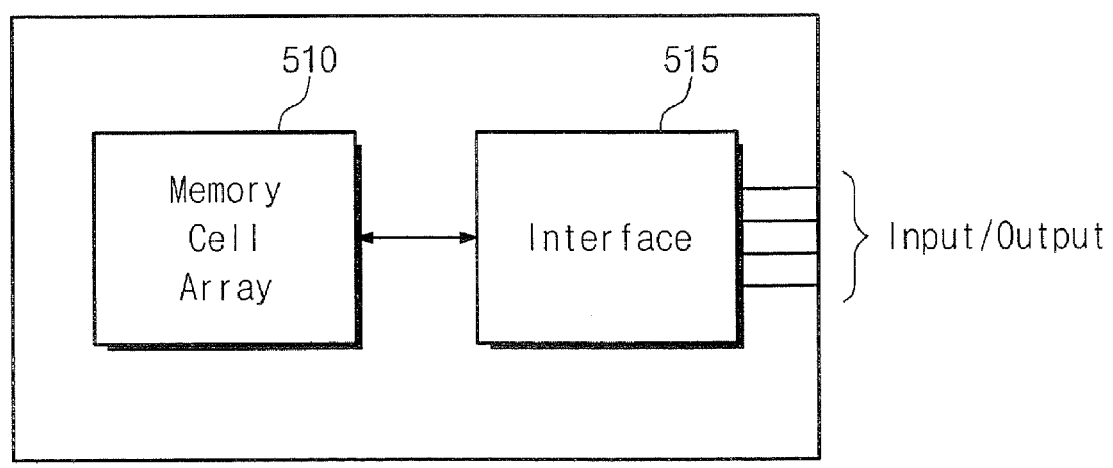

FIG. 11 illustrates an apparatus including a resistive memory device according to an embodiment of the present invention. As shown in the drawing, the apparatus of the present embodiment includes a memory 510 connected with an interface 515. The memory 510 may include a memory device according to the aforementioned embodiments of the present invention. The interface 515 may provide, for example, an external input signal. For example, the interface 515 may provide a command language and an address signal. The interface 515 may control the memory 510 based on a control signal which is generated from an outside and received.

Figure 12:
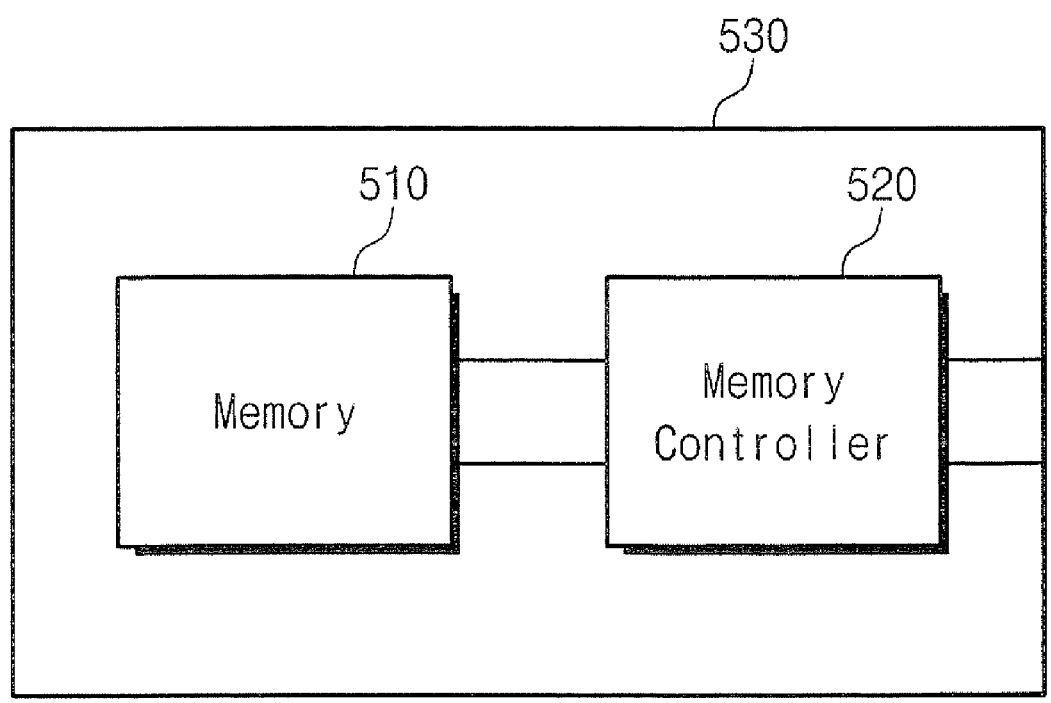

FIG. 12 illustrates an apparatus including a resistive memory device according to an embodiment of the present invention. As shown in the drawing, the apparatus of the present invention is similar to the apparatus of FIG. 10 except that the memory 510 and the memory controller 520 are embodied by a memory card 530. For example, the memory card 530 may be a memory card satisfying a standard for compatibility with electronic appliances, such as digital cameras, personal computers or the like. The memory controller 520 may control the memory 510 based on a control signal which the memory card receives from a different device, for example, an external device.

Figure 13:
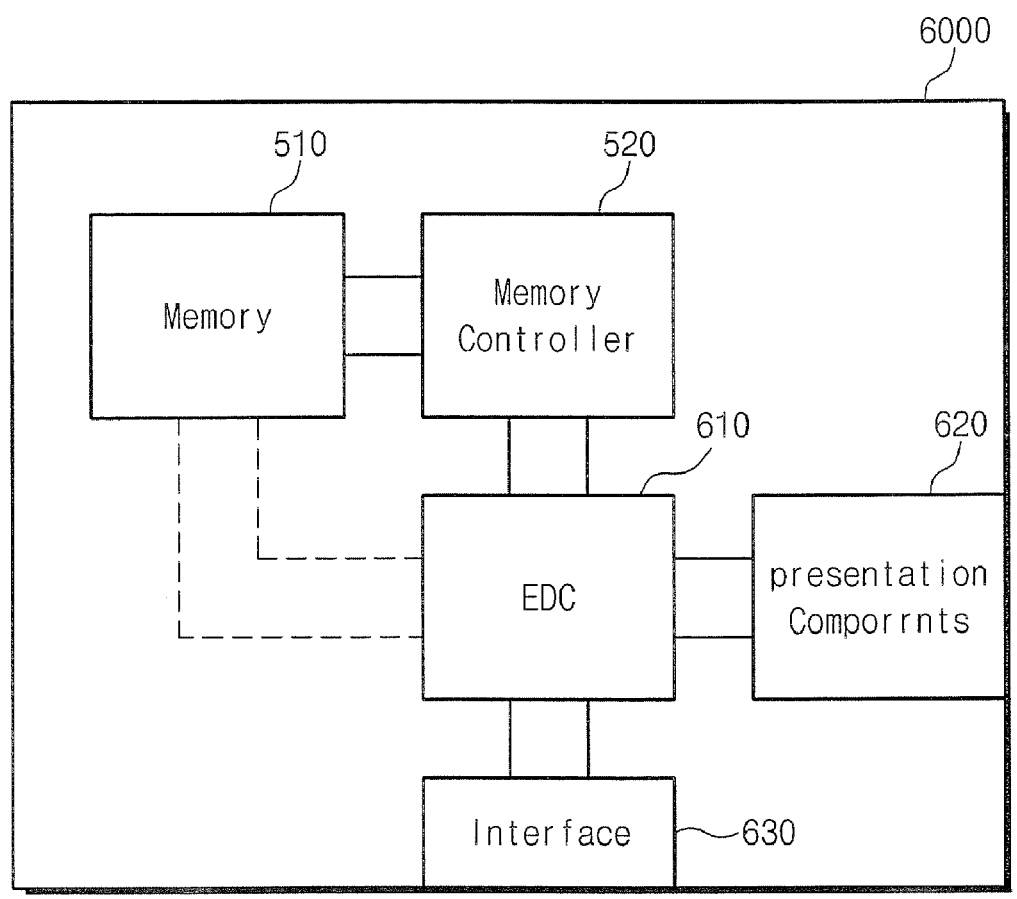

FIG. 13 illustrates a mobile device 6000 including a resistive memory device according to an embodiment of the present invention. The mobile device 6000 may be an MP3, a video player, a video, audio player or the like. As shown in the drawing, the mobile device 6000 includes a memory 510 and a memory controller 520. The memory 510 includes a resistive memory device according to the aforementioned embodiments of the present invention. The mobile device 6000 may include an encoder and decoder EDC 610, a presentation component 620, and an interface 630. Data such as videos and audios may be exchanged between the memory 510 and the encoder and decoder EDC 610 via the memory controller 520. As indicated by a dotted line, data may be directly exchanged between the memory 510 and the encoder and decoder EDC 610.

EDC 610 may encoder data to be stored in the memory 510. For example, EDC 610 may encode an audio data into an MP3 file and store the encoded MP3 file in the memory 510. Alternatively, EDC 610 may encode an MPEG video data (e.g., MPEG3. MPEG4, etc.) and store the encoded video data in the memory 510. Also, EDC 610 may include a plurality of encoders that encode a different type of data according to a different data format. For example, EDC 610 may include an MP3 encoder for audio data and an MPEG encoder for video data. EDC 610 may decode output data from the memory 510. For example, EDC 610 may decode audio data outputted from the memory 510 into an MP3 file. Alternatively, EDC 610 may decode video data outputted from the memory 510 into an MPEG file. Also, EDC 610 may include a plurality of decoders that decode a different type of data according to a different data format. For example, EDC 610 may include an MP3 decoder for audio data and an MPEG decoder for video data. Also, EDC 610 may include only a decoder. For example, previously encoded data may be delivered to EDC 610, decoded and then delivered to the memory controller 520 and/or the memory 510.

EDC 610 receives data for encoding or previously encoded data via the interface 630. The interface 630 may comply with a well-known standard (e.g., USB, firewire, etc.). The interface 630 may include one or more interfaces. For example, the interface 630 may include a firewire interface, a USB interface, etc. The data provided from the memory 510 may be outputted via the interface 630.

The representation component 620 represents data decoded by the memory 510 and/or EDC 610 such that a user can perceive the decoded data. For example, the representation component 620 may include a display screen displaying a video data, etc., and a speaker jack for outputting an audio data.

Figure 14:
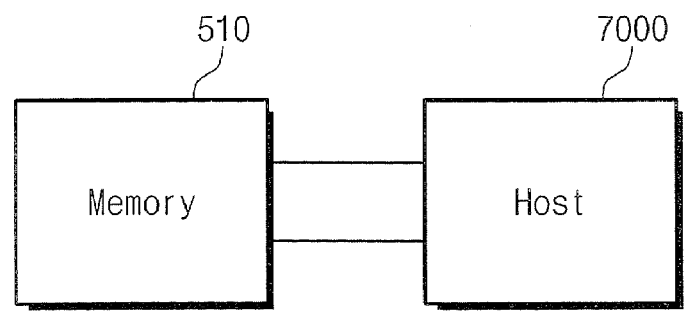

FIG. 14 illustrates an apparatus including a resistive memory device according to an embodiment of the present invention. As shown in the drawing, the memory 510 may be connected with a host system 7000. The memory 510 includes a resistive memory device according to the aforementioned embodiments of the present invention. The host system 7000 may be a processing system such as a personal computer, a digital camera, etc. The memory 510 may be a detachable storage medium form, for example, a memory card, a USB memory, or a solid-state driver SSD. The host system 7000 may provide an input signal for controlling an operation of the memory 510. For example, the host system 7000 may provide a command language and an address signal.

Figure 15:
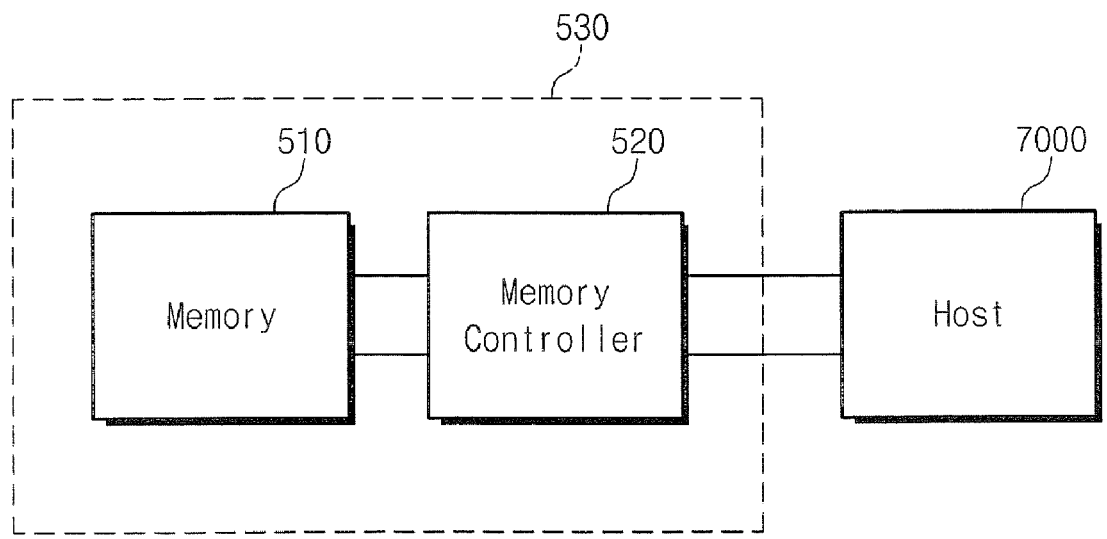

FIG. 15 illustrates an apparatus including a resistive memory device according to an embodiment of the present invention. In this embodiment, a host system 7000 is connected with a memory card 530. The host system 7000 supplies a control signal to the memory card 530 such that a memory controller 520 controls an operation of a memory 510.

Figure 16:
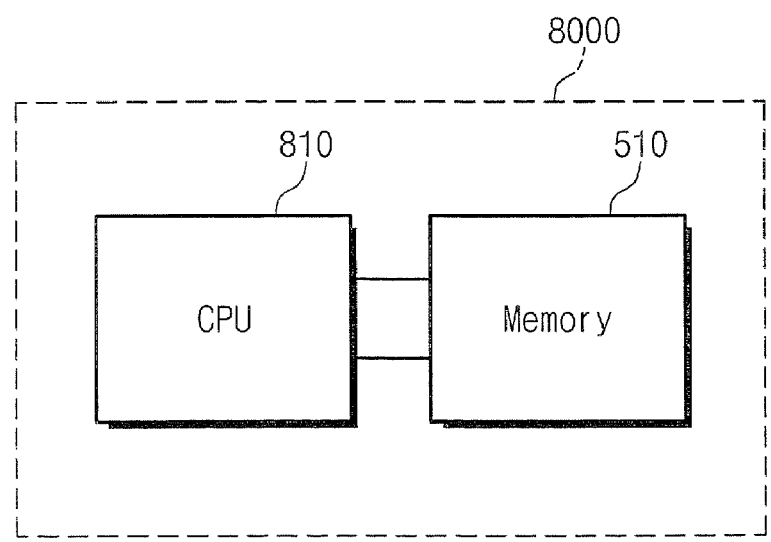

FIG. 16 illustrates an apparatus including a resistive memory device according to an embodiment of the present invention. As shown in the drawing, according to the apparatus of the present embodiment, a memory 510 may be connected with a central processing unit CPU 810 in a computer system 8000. For example, the computer system 8000 may be a personal computer, a personal data assistant, etc.

The memory 510 may be connected with the CPU 810 via a bus.

Figure 17:
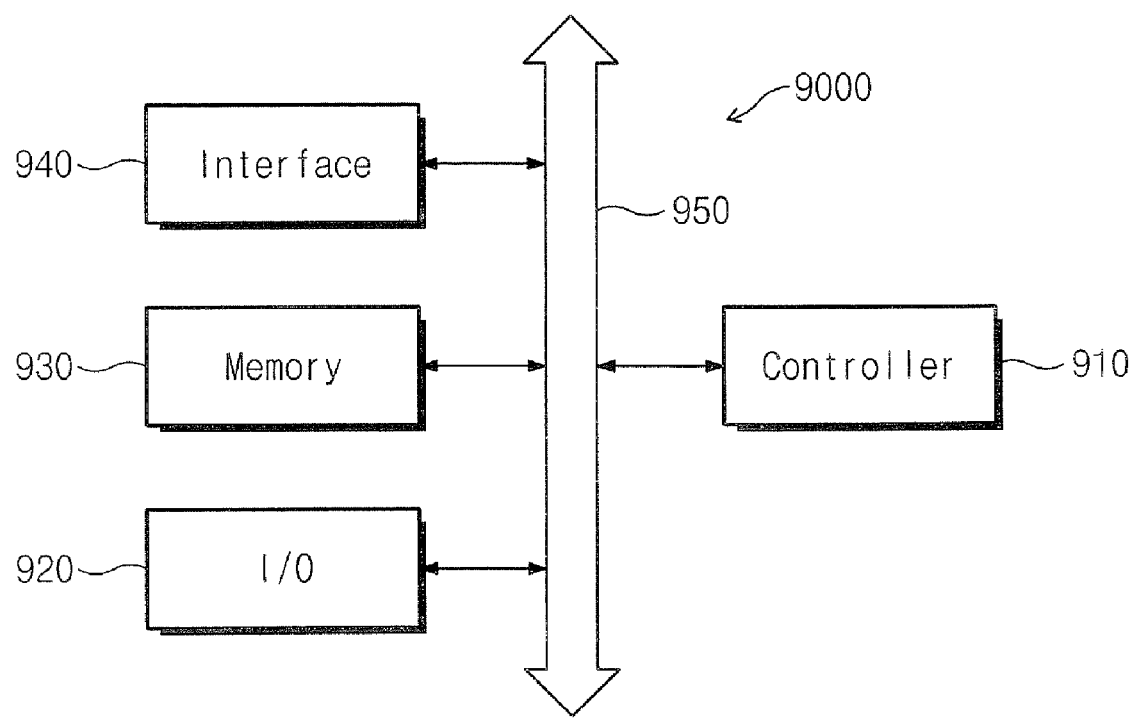

FIG. 17 illustrates an apparatus including a resistive memory device according to an embodiment of the present invention. As shown in the drawing, the apparatus 9000 according to the present embodiment may include a controller 910, an input/output unit 920 such as a keyboard, a display or the like, a memory 930, and an interface 940. In the present embodiment, the respective components constituting the apparatus may be connected with each other via a bus 950.

The controller 910 may include at least one microprocessor, digital processor, microcontroller, or processor. The memory 930 may store a command executed by data and/or the controller 910. The interface 940 may be used to transmit data from a different system, for example, a communication network, or to a communication network. The apparatus 9000 may be a mobile system such as a PDA, a portable computer, a web tablet, a wireless phone, a mobile phone, a digital music player, a memory card or a different system that can transmit and/or receive information.

FIGS. 10 through 17 show apparatuses including a phase-change memory device according to embodiments of the present invention.

According to embodiments of the present invention, a dual stud structure of a lower stud and an upper stud can be employed to form a copper stud, a copper bit line, a copper local conductive line, and/or a copper word line with a superior resistive characteristic using a damascene technique.

According to embodiments of the present invention, a copper stud can be formed simultaneously with a copper bit line or a copper conductive line to decrease the contact resistance.

According to embodiments of the present invention, a dual stud structure can be employed to reduce an aspect ratio of an opening in which a copper stud is formed, resulting in enhancement of filling characteristic of copper.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A resistive memory device comprising:
   a resistive memory element on a substrate;
   a bit line on the resistive memory element;
   an upper stud outside of the resistive memory element, the
      upper stud containing the same material as the bit line and having a lower surface which is leveled higher than a lower surface of the bit line and an upper surface which is substantially coplanar with an upper surface of the bit line; and a lower stud between the substrate and the upper stud, the lower stud being connected with the upper stud and formed of a different material than the upper stud, wherein an interface surface between the upper stud and the lower stud is disposed lower than an upper surface of the bit line and is disposed higher than a lower surface of the bit line.

2. The resistive memory device of claim 1, wherein the bit line and the upper stud each comprise copper.

3. The resistive memory device of claim 2, further comprising:

a contact plug between the lower stud and the substrate, the contact plug being electrically connected with a lower word line of the substrate and the lower stud and having a diameter greater than a diameter of a lower surface of the lower stud; and an upper word line on the upper stud and electrically connected with the upper stud.

4. The resistive memory device of claim 2, further comprising:

a cell lower stud between the substrate and the upper stud, connected with the upper stud, having an upper surface which is leveled higher than the lower surface of the bit line and formed of a different material than the upper stud;

a peripheral lower stud outside of the resistive memory element, the peripheral lower stud being formed of a different material than the upper stud; and a conductive line on a part of a side surface of the peripheral lower stud and on an upper surface of the peripheral lower stud, the conductive line being formed of the same material as the bit line.

5. The resistive memory device of claim 1, wherein the lower stud comprises tungsten.

6. The resistive memory device of claim 1, further comprising a conductive line on the upper stud, the conductive line being electrically connected with the upper stud and functioning as a word line.

7. The resistive memory device of claim 6, wherein the conductive line functioning as a word line contains copper.

8. A resistive memory device comprising:

a resistive memory element on a substrate;

a bit line on the resistive memory element, the bit line containing copper and an upper surface which is substantially coplanar with an upper surface of the bit line;

a cell upper stud outside the resistive memory element, and formed simultaneously with, the cell upper stud having a lower surface which is leveled higher than a lower surface of the bit line and containing copper; and a cell lower stud connected with the lower surface of the cell upper stud and containing a different material than the cell upper stud wherein an interface surface between the cell upper stud and the cell lower stud is disposed lower than an upper surface of the bit line and is disposed higher than a lower surface of the bit line.

9. The resistive memory device of claim 8, wherein the cell lower stud comprises tungsten.

10. The resistive memory device of claim 8, further comprising a cell contact plug between the cell lower stud and the substrate, the cell contact plug being connected with the cell lower stud and the substrate and having an upper surface with a diameter wider than a diameter of a lower surface of the cell lower stud.

11. The resistive memory device of claim 10, further comprising a conductive line on the cell upper stud, the conductive line being electrically connected with the cell upper stud, containing copper and functioning as a word line.

12. The resistive memory device of claim 8, further comprising:

a peripheral lower stud outside of the resistive memory element, the peripheral lower stud being formed of a different material than the cell upper stud, wherein a height of an upper surface of the peripheral lower stud and a height of a lower surface of the peripheral lower stud are substantially the same height as a height of an upper surface of the cell lower stud and a height of a lower surface of the cell lower stud, respectively; and a conductive line on a part of a side surface of the peripheral lower stud and on an upper surface of the peripheral lower stud, the conductive line containing copper.

13. A resistive memory device comprising:

a resistive memory element on a cell array region of a substrate;

a bit line on the resistive memory element, the bit line containing copper;

a cell upper stud outside of the resistive memory element, the cell upper stud having a lower surface which is leveled higher than a lower surface of the bit line and containing copper, and an upper surface which is substantially coplanar with an upper surface of the bit line;

a cell lower stud connected with the lower surface of the cell upper stud, the cell lower stud including a different material than the cell upper stud; and a cell contact plug between the substrate and the cell lower stud, the cell contact plug being electrically connected with the substrate and the cell lower stud and having an upper surface with a diameter wider than a diameter of a lower surface of the cell lower stud, wherein an interface surface between the cell upper stud and the cell lower stud is disposed lower than an upper surface of the bit line and is disposed higher than a lower surface of the bit line.

14. The resistive memory device of claim 13, further comprising:

a peripheral contact plug on a peripheral circuit region of the substrate;

a peripheral lower stud electrically connected with the peripheral contact plug;

a first conductive line on a part of a side surface of the peripheral lower stud and on an upper surface of the peripheral lower stud, the first conductive line being formed of the same material as the bit line;

a word line electrically connected with the cell upper stud; and a second conductive line electrically connected with the first conductive line, the second conductive line being formed of the same material as the word line.

15. The resistive memory device of claim 14, wherein the second conductive line and the word line each comprise copper.

16. A resistive memory device comprising:

a lower interconnection line;

an upper interconnection line crossing over the lower interconnection line;

a resistive memory element disposed at an intersection region between the lower interconnection line and the upper interconnection line; and a plug structure spaced apart from the resistive memory element and electrically connected to the lower interconnection line, the plug structure including a lower stud and an upper stud on the lower stud, wherein the upper stud contains the same material as the upper interconnection line and has an upper surface which is substantially coplanar with an upper surface of the upper interconnection line, the lower stud is formed of a different material than the upper stud and has a lower surface which is substantially coplanar with a lower surface of the resistive memory element, and wherein an interface surface between the upper stud and the lower stud is disposed lower than an upper surface of the upper interconnection line and is disposed higher than a lower surface of the upper interconnection line.

\* \* \* \* \*